United States Patent
Wigley

(10) Patent No.: US 10,509,182 B2
(45) Date of Patent: Dec. 17, 2019

(54) OPTICAL COUPLING SYSTEMS FOR OPTICALLY COUPLING LASER DIODES TO OPTICAL FIBERS

(71) Applicant: Corning Incorporated, Corning, NY (US)

(72) Inventor: Peter Gerard Wigley, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/737,596

(22) PCT Filed: Jun. 15, 2016

(86) PCT No.: PCT/US2016/037539
§ 371 (c)(1),
(2) Date: Dec. 18, 2017

(87) PCT Pub. No.: WO2016/205306
PCT Pub. Date: Dec. 22, 2016

(65) Prior Publication Data
US 2019/0004262 A1  Jan. 3, 2019

Related U.S. Application Data

(60) Provisional application No. 62/181,396, filed on Jun. 18, 2015.

(51) Int. Cl.
*G02B 6/26* (2006.01)
*G02B 6/42* (2006.01)
(Continued)

(52) U.S. Cl.
CPC ......... *G02B 6/4206* (2013.01); *G02B 6/0006* (2013.01); *G02B 6/368* (2013.01);
(Continued)

(58) Field of Classification Search
USPC ..................................... 385/42, 88
See application file for complete search history.

(56) References Cited

U.S. PATENT DOCUMENTS

| 4,367,011 A | 1/1983 | Monaghan |
| 4,861,127 A * | 8/1989 | Failes .................. G02B 6/2826 385/42 |

(Continued)

FOREIGN PATENT DOCUMENTS

| CN | 102854731 A | 1/2013 |
| DE | 19652159 B4 | 5/2006 |

(Continued)

OTHER PUBLICATIONS

International Search Report and Written Opinion of The International Searching Authority; PCT/US2016/037539 dated Mar. 24, 2017; 21 Pages; European Patent Office.

(Continued)

*Primary Examiner* — Eric Wong

(57) ABSTRACT

Optical coupling systems are provided. An optical coupling system includes a first optical fiber end (122a) having a first core (124a), a second optical fiber end (122b) having a second core (124b), and a laser diode (110) optically coupled to the first core and the second core at an optical coupling location. The laser diode emits a light beam having an asymmetrical cross-sectional light beam profile comprising a fast axis diameter and a slow axis diameter. The fast axis diameter is longer than the slow axis diameter. Further, the first optical fiber end and the second optical fiber end are adjacently positioned along the fast axis diameter of the asymmetrical cross-sectional light beam profile of the laser diode at the optical coupling location such that the first core and the second core are within the asymmetrical cross-sectional light beam profile at the optical coupling location.

16 Claims, 9 Drawing Sheets

(51) Int. Cl.
*F21V 8/00* (2006.01)
*G02B 6/36* (2006.01)
*H01S 5/00* (2006.01)
*H01S 5/022* (2006.01)

(52) U.S. Cl.
CPC ........... *G02B 6/3644* (2013.01); *G02B 6/421* (2013.01); *G02B 6/4213* (2013.01); *G02B 6/4256* (2013.01); *H01S 5/005* (2013.01); *H01S 5/02284* (2013.01); *G02B 6/001* (2013.01); *G02B 6/4249* (2013.01)

(56) References Cited

U.S. PATENT DOCUMENTS

| | | | |
|---|---|---|---|
| 5,148,508 A * | 9/1992 | Anjan | G02B 6/2835 385/42 |
| 5,263,104 A * | 11/1993 | Anjan | G02B 6/2835 385/42 |
| 5,290,277 A | 3/1994 | Vercimak et al. | |
| 5,734,766 A * | 3/1998 | Flint | G02B 6/04 385/42 |
| 5,740,288 A | 4/1998 | Pan | |
| 6,014,256 A | 1/2000 | Cheng | |
| 6,362,919 B1 | 3/2002 | Flanders | |
| 6,490,388 B1 | 12/2002 | Manzur | |
| 6,504,961 B1 | 1/2003 | Findakly et al. | |
| 6,527,458 B2 | 3/2003 | Kim | |
| 7,274,717 B1 | 9/2007 | Minden et al. | |
| 8,545,076 B2 | 10/2013 | Bickham et al. | |
| 8,591,087 B2 | 11/2013 | Bickham et al. | |
| 8,620,125 B2 | 12/2013 | Button et al. | |
| 8,711,336 B1 * | 4/2014 | Frogget | G01S 7/4812 356/27 |
| 8,724,942 B2 | 5/2014 | Logunov et al. | |
| 8,761,222 B2 | 6/2014 | Stoppel et al. | |
| 8,787,717 B2 | 7/2014 | Logunov | |
| 8,897,612 B2 | 11/2014 | Logunov | |
| 8,967,845 B2 | 3/2015 | Bennett et al. | |
| 9,494,738 B1 * | 11/2016 | Farmer | G02B 6/1228 |
| 2003/0160964 A1 | 8/2003 | Dallas et al. | |
| 2004/0222365 A1 * | 11/2004 | Tobiason | G01D 5/268 250/231.13 |
| 2008/0259633 A1 | 10/2008 | Wang | |
| 2012/0213480 A1 | 8/2012 | Zayer et al. | |
| 2013/0148966 A1 | 6/2013 | Kurokawa et al. | |
| 2013/0343757 A1 | 12/2013 | Wigley et al. | |

FOREIGN PATENT DOCUMENTS

| | | |
|---|---|---|
| FR | 2890455 B1 | 5/2008 |
| JP | 62119507 A | 5/1987 |
| JP | 05191771 B2 | 5/2013 |
| WO | 2014049145 A1 | 4/2014 |

OTHER PUBLICATIONS

Invitation to Pay Additional Fees From The International Searching Authority; PCT/US2016/037539 dated Sep. 28, 2016; 7 Pages; European Patent Office.

English Translation of CN201680035479.X First Office Action Dated Jun. 5, 2019, China Patent Office, 11 Pgs.

* cited by examiner

OPTICAL COUPLING SYSTEMS FOR OPTICALLY COUPLING LASER DIODES TO OPTICAL FIBERS

This application is a national stage application under 35 U.S.C. § 371 of International Patent Application Serial No. PCT/US2016/37539 filed on Jun. 15, 2016, which claims the benefit of priority of U.S. Provisional Application Ser. No. 62/181,396 filed on Jun. 18, 2015, the contents of both are relied upon and incorporated herein by reference in their entireties.

TECHNICAL FIELD

The present specification generally relates to optical coupling systems and, more particularly, to optical coupling systems for optically coupling a laser diode to a plurality of optical fiber ends.

BACKGROUND

Optical fibers may be utilized in a variety of diverse applications in which light from a light source, such as a laser diode, is propagated along a length of the optical fiber. In some applications, such as lighting, signage, biological applications, etc. Light diffusing optical fibers may be utilized such that light propagating along the length of the light diffusing optical fiber is scattered radially outward along a length of the fiber.

Accordingly, a need exists for optical coupling systems for optically coupling laser diodes to a plurality of optical fibers, such as light diffusing optical fibers.

SUMMARY

In one embodiment, an optical coupling system includes a first optical fiber end having a first core, a second optical fiber end having a second core, and a laser diode optically coupled to the first core of the first optical fiber end and the second core of the second optical fiber end at an optical coupling location. The laser diode emits a light beam having an asymmetrical cross-sectional light beam profile comprising a fast axis diameter and a slow axis diameter. The fast axis diameter is longer than the slow axis diameter. Further, the first optical fiber end and the second optical fiber end are adjacently positioned along the fast axis diameter of the asymmetrical cross-sectional light beam profile of the laser diode at the optical coupling location such that the first core and the second core are within the asymmetrical cross-sectional light beam profile at the optical coupling location In another embodiment, an optical coupling system includes a laser diode emitting a light beam and a fiber housing ferrule configured to house a first optical fiber end and a second optical fiber end. The fiber housing ferrule includes a ferrule body having a light input end opposite a light output end, a first fiber housing hole extending between the light input end and the light output end at a first angle relative to a longitudinal axis of the fiber housing ferrule, and a second fiber housing hole extending between the light input end and the light output end at a second angle relative to the longitudinal axis of the fiber housing ferrule. The first fiber housing hole and the second fiber housing hole are spaced apart at the light output end. A separation distance between the first fiber housing hole and the second fiber housing hole decreases in a direction from the light output end toward the light input end. The first fiber housing hole is adjacent to the second fiber housing hole at the light input end. Further, the first fiber housing hole and the second fiber housing hole are optically coupled to the laser diode at the light input end such that when the laser diode emits the light beam, the first fiber housing hole and the second fiber housing hole are each positioned within a cross-sectional light beam profile of the light beam at the light input end.

In yet another embodiment, an optical coupling system includes a first light diffusing optical fiber end, a second light diffusing optical fiber end, a laser diode configured to emit a light beam, and a birefringent crystal. The birefringent crystal is disposed between the laser diode and both the first light diffusing optical fiber end and the second light diffusing optical fiber end. The birefringent crystal is configured to: split the light beam into a first light beam and a second light beam, direct the first light beam into the first light diffusing optical fiber end, and direct the second light beam into the second light diffusing optical fiber end.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to optical coupling systems comprising a laser diode optically coupled to a plurality of optical fiber ends (e.g., a plurality of light diffusing optical fiber ends, a plurality of transport optical fiber ends, or the like). The laser diode is configured to emit a light beam along an optical pathway. In some embodiments, the light beam comprises a cross-sectional light beam profile, such as an asymmetrical cross-sectional light beam profile and the plurality of optical fiber ends may be optically coupled to the cross-sectional light beam profile at an optical coupling location. In some embodiments, two optical fiber ends may be adjacently positioned within the cross-sectional light beam profile at the optical coupling location. Some optical coupling systems described herein comprise a fiber housing ferrule having fiber housing holes configured to house and adjacently position optical fiber ends at a light input end. Some optical coupling systems described herein comprise a birefringent crystal configured to split a light beam emitted by the laser diode and direct portions of the light beam into two optical fiber ends.

Figure 1:
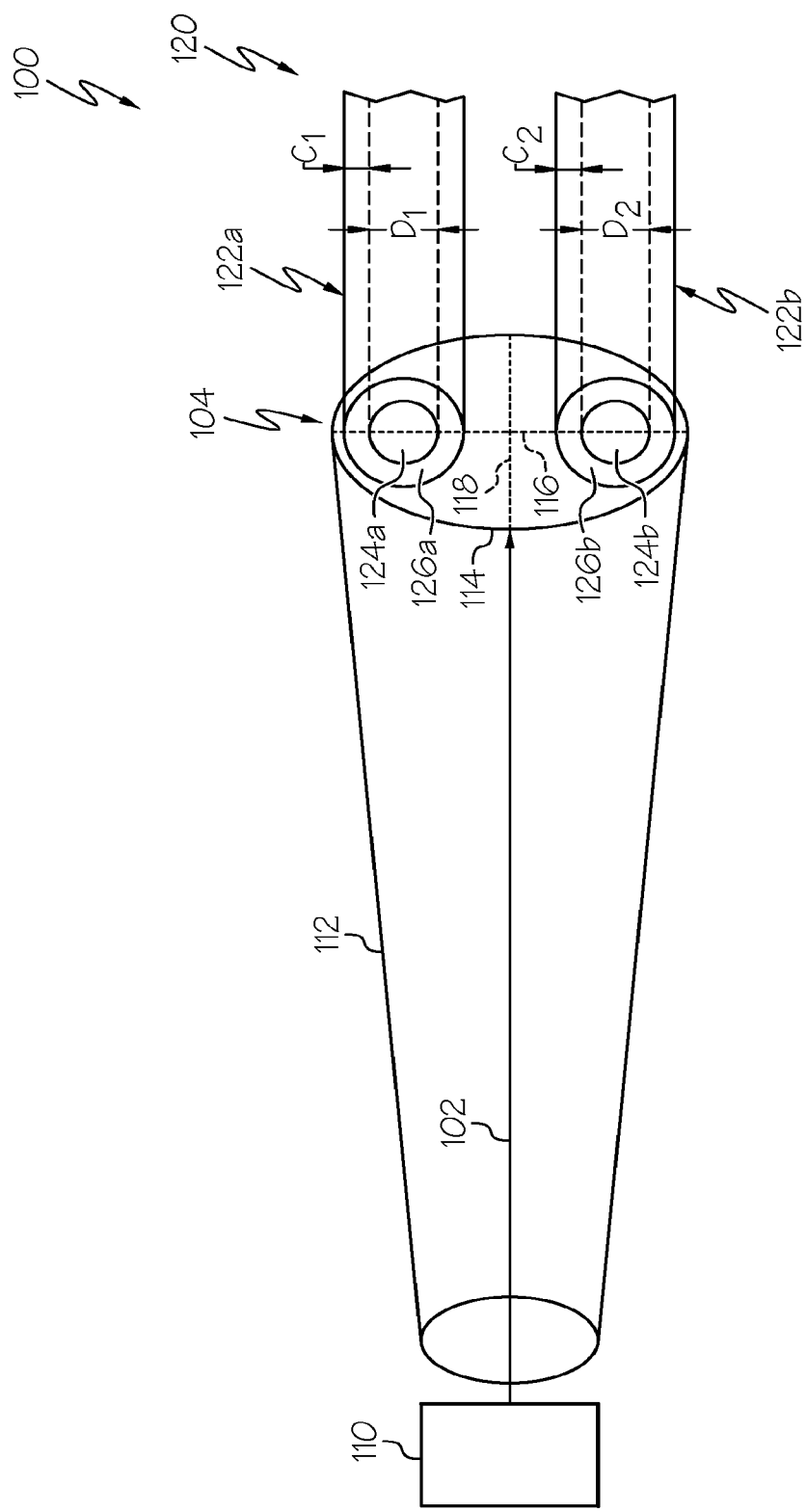
FIG. 1 schematically depicts an optical coupling system including a laser diode optically coupled to a first optical fiber end and a second optical fiber end at an optical coupling location, according to one or more embodiments described herein.

Referring now to FIG. 1, a schematic view of an optical coupling system 100 is depicted. The optical coupling system 100 comprises a laser diode 110 configured to emit a light beam 112 along an optical pathway 102. The laser diode 110 may comprise any laser diode, for example, a multimode laser diode, single mode laser diode, a SiP laser diode, VCSEL laser diode, or the like. In some embodiments, the laser diode 110 is hermetically sealed within a TO package. In some embodiments, an emission point of the laser diode 110 may be spaced apart from an output window of the TO package by between about 0.5 mm and 1 mm, such as, for example 0.7 mm, 0.85 mm, or the like. The laser diode 110 is configured to emit a light beam 112 having a cross-sectional light beam profile 114. When the laser diode 110 is a multimode laser diode, the cross-sectional light beam profile 114 may have an asymmetrical shape, such as an ellipse, an oval, or the like. In other embodiments, the cross-sectional light beam profile 114 may be symmetrical, for example, circular. While only one laser diode 110 is depicted in FIG. 1, it should be understood that in other embodiments the optical coupling system 100 may comprise two or more laser diodes 110 positioned within a single TO package.

As depicted in FIG. 1, the cross-sectional light beam profile 114 comprises a fast axis diameter 116 and a slow axis diameter 118. When the cross-sectional light beam profile 114 is asymmetrical, the fast axis diameter 116 is longer than the slow axis diameter 118. In some embodiments, the ratio between the length of the fast axis diameter and the slow axis diameter is 3:2, 2:1, 3:1, or 4:1. In other embodiments, the fast axis diameter 116 and the slow axis diameter 118 may have different length relationships. In one example embodiment in which the laser diode 110 is positioned within a TO package, the light beam 112 may comprise a fast axis diameter 116 of about 562 µm and a slow axis diameter 118 of about 170 µm at the output window of the TO package. In alternative embodiments, when the cross-sectional light beam profile 114 is symmetrical, the fast axis diameter 116 and the slow axis diameter 118 comprise substantially the same diameter.

Referring still to FIG. 1, the optical coupling system 100 comprises a plurality of optical fiber ends 120 positioned within the optical pathway 102 of the laser diode 110 and optically coupled to the laser diode 110 at an optical coupling location 104. The laser diode 110 and the plurality of optical fiber ends 120 may be optically coupled by aligning the laser diode 110 and the plurality of optical fiber ends 120 such that at least some of the light beam 112 emitted by the laser diode 110 is received by each of the plurality of optical fiber ends 120. In some embodiments, the plurality of optical fiber ends 120 comprise a first optical fiber end 122a having a first core 124a and a first cladding 126a and a second optical fiber end 122b having a second core 124b and a second cladding 126b. In some embodiments, each of the plurality of optical fiber ends 120 may further comprise one or more of a coating, a sheath, or a jacket circumscribing the cladding 126a, 126b.

In some embodiments, the first optical fiber end 122a is an end of a first optical fiber and the second optical fiber end 122b is an end of a second optical fiber. In other embodiments, such as the embodiment depicted in FIG. 2, the first optical fiber end 122a and the second optical fiber end 122b are opposing ends of the same optical fiber. While the plurality of optical fiber ends 120 are described as comprising the first optical fiber end 122a and the second optical fiber end 122b, it should be understood that the plurality of optical fiber ends 120 may comprise more than two optical fiber ends. It should be understood that any number of optical fiber ends may be positioned within the optical pathway 102 of the laser diode 110 at the optical coupling location 104. Further, in some embodiments, the first and second optical fiber ends 122a, 122b may be butt coupled to the laser diode 110. For example, when the laser diode 110 is positioned within a TO package, the first and second optical fiber ends 122a, 122b may be butt coupled to the emission window of the TO package. Butt coupling the first and second optical fiber ends 122a, 122b to the laser diode 110 may provide a coupling efficiency of between about 50% and about 70%.

Figure 2:
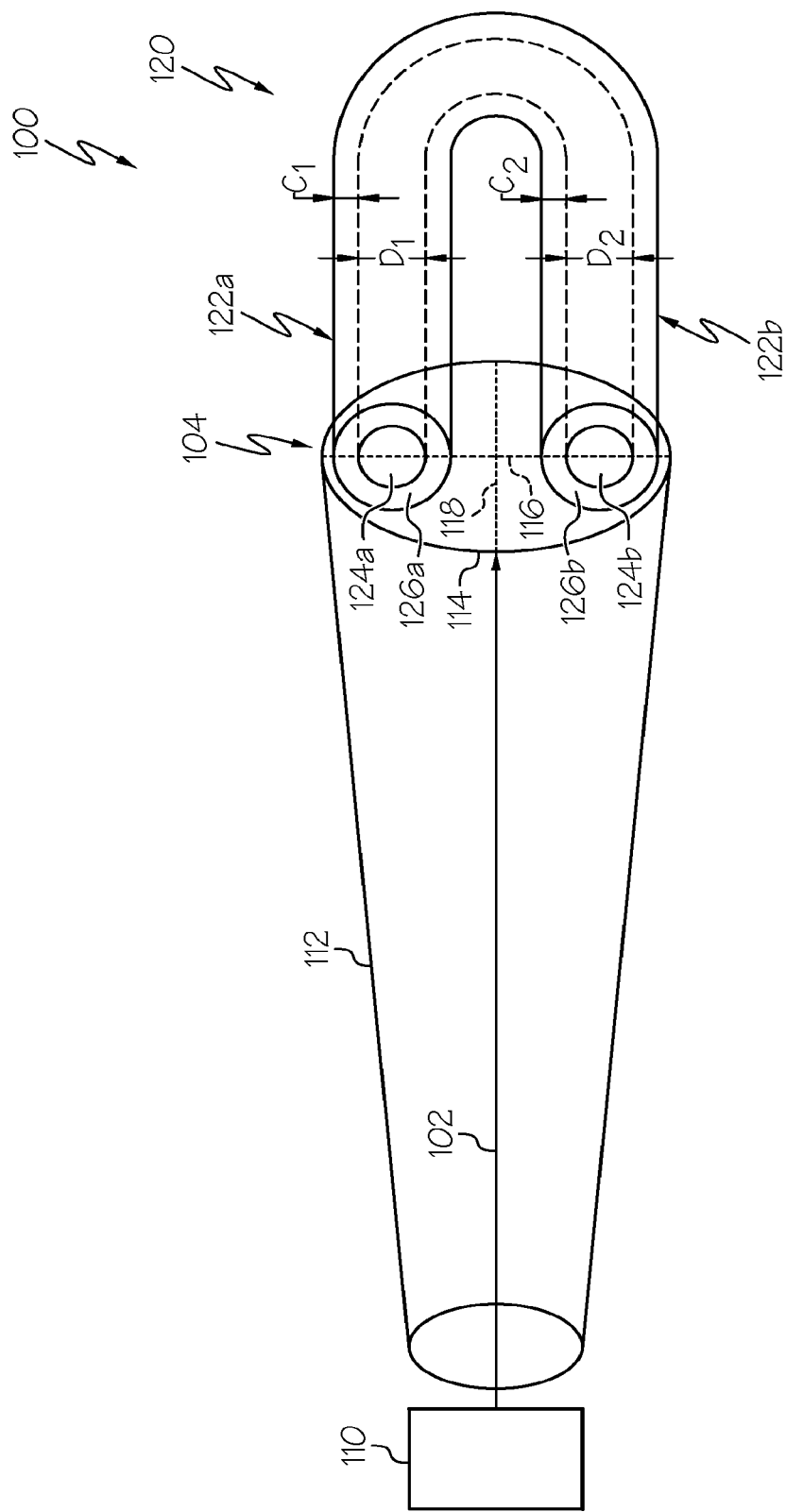
FIG. 2 schematically depicts an optical coupling system including a laser diode optically coupled to opposing optical fiber ends of an individual optical fiber at an optical coupling location, according to one or more embodiments described herein.

Referring now to FIGS. 1 and 2, the first optical fiber end 122a and the second optical fiber end 122b are adjacently positioned within the optical pathway 102 at the optical coupling location 104. When the laser diode 110 emits the light beam 112, the first optical fiber end 122a and the second optical fiber end 122b may be adjacently positioned within the cross-sectional light beam profile 114 of the light beam 112. In some embodiments, the first optical fiber end 122a and the second optical fiber end 122b are adjacently positioned along the fast axis diameter 116 of the cross-sectional light beam profile 114. The fast axis diameter 116 may be sized such that the first core 124a and the second core 124b are within the cross-sectional light beam profile 114 at the optical coupling location 104. For example, the fast axis diameter 116 may be greater than or equal to a sum of a core diameter $D_1$ of the first core 124a and a core diameter $D_2$ of the second core 124b.

In some embodiments, the first cladding 126a and the second cladding 126b may be removed along at least a portion of the first optical fiber end 122a and the second optical fiber end 122b, respectively, such that the first core 124a and the second core 124b are exposed along the portion of the first optical fiber end 122a and the second optical fiber end 122b. In such embodiments, the first core 124a and the second core 124b may be adjacently positioned, for example, within a threshold distance (e.g., about 25 µm) or in contact. In such embodiments, the fast axis diameter 116 may be greater than or equal to the sum of the core diameter $D_1$ of the first core 124a and the core diameter $D_2$ of the second core 124b. By providing a cross-sectional light beam profile 114 that has a fast axis diameter 116 greater than or equal to the sum of core diameters $D_1$ and $D_2$ at the optical coupling location 104, optical coupling loss between the laser diode 110 and the first and second optical fiber ends 122a, 122b may be minimized.

In embodiments in which the first and second claddings 126a, 126b circumscribe the first and second cores 124a, 124b at the optical coupling location 104, the fast axis diameter 116 may be greater than the sum of the core diameter $D_1$ and the core diameter $D_2$. For example, the difference between the fast axis diameter 116 and the sum of the core diameter $D_1$ and the core diameter $D_2$ may be greater than or equal to the sum of a cladding thickness $C_1$ of the first cladding 126a and a cladding thickness $C_2$ of the second cladding 126b such that the first core 124a and the second core 124b are within the cross-sectional light beam profile 114 at the optical coupling location 104.

In some embodiments, the plurality of optical fiber ends 120 may comprise ends of light diffusing optical fibers. The light diffusing optical fibers include a core comprising glass, such as silica. In some embodiments, the core comprises pure silica and in other embodiments the core comprises silica having one or more dopants, (e.g., Ge, Al, Ti, and/or P). The core may comprise a numerical aperture (NA) between about 0.1 and about 0.8 (e.g., 0.22, 0.45, 0.53, 0.55, 0.57, or the like). Further, the core may comprise a diameter of between about 150 µm and about 200 µm, (e.g., 160 µm, 170 µm, 180 µm, or the like). The light diffusing optical fibers also include a cladding comprising a material having a low refractive index. The cladding may include a low index polymer such as ultraviolet (UV) curable or thermally curable acrylate, fluoroacrylate, or silicone. By providing a cladding surrounding the core, a waveguide may be formed having a high NA. In some embodiments, the diameter of the cladding may comprise between about 80 µm and 250 µm (e.g., 120 µm, 180 µm, 230 µm, or the like).

In embodiments in which the plurality of optical fiber ends 120 are ends of light diffusing optical fibers, the light diffusing optical fibers may further comprise a plurality of periodic or non-periodic nano-sized structures and/or voids positioned within the core or at a core-cladding boundary. In operation, the light diffusing optical fibers are configured to scatter light away from the core and through an outer surface of the cladding via the nano-sized structures. Light diffusing optical fibers are configured to radiate light along their length. In some embodiments, the light diffusing optical fibers further comprise an optional coating that surrounds the cladding, for example, a polymer coating such as an acrylate-based or silicone based polymer, or a fluorescent material that generates one or more colors when light diffuses through the coating.

Still referring to FIG. 1, in some embodiments, the first optical fiber end 122a is an end of a first light diffusing optical fiber and the second optical fiber end 122b is an end of a second light diffusing optical fiber. In other embodiments, such as the embodiment depicted in FIG. 2, the first optical fiber end 122a and the second optical fiber end 122b are opposing ends of the same light diffusing optical fiber. By optically coupling opposing ends of the same light diffusing optical fiber to the laser diode 110, light propagates into both ends of the light diffusing optical fibers. This provides a more uniform illumination along the length of the light diffusing optical fiber because each end of the light diffusing optical fiber receives substantially equivalent power components of the light beam 112.

Figure 3:
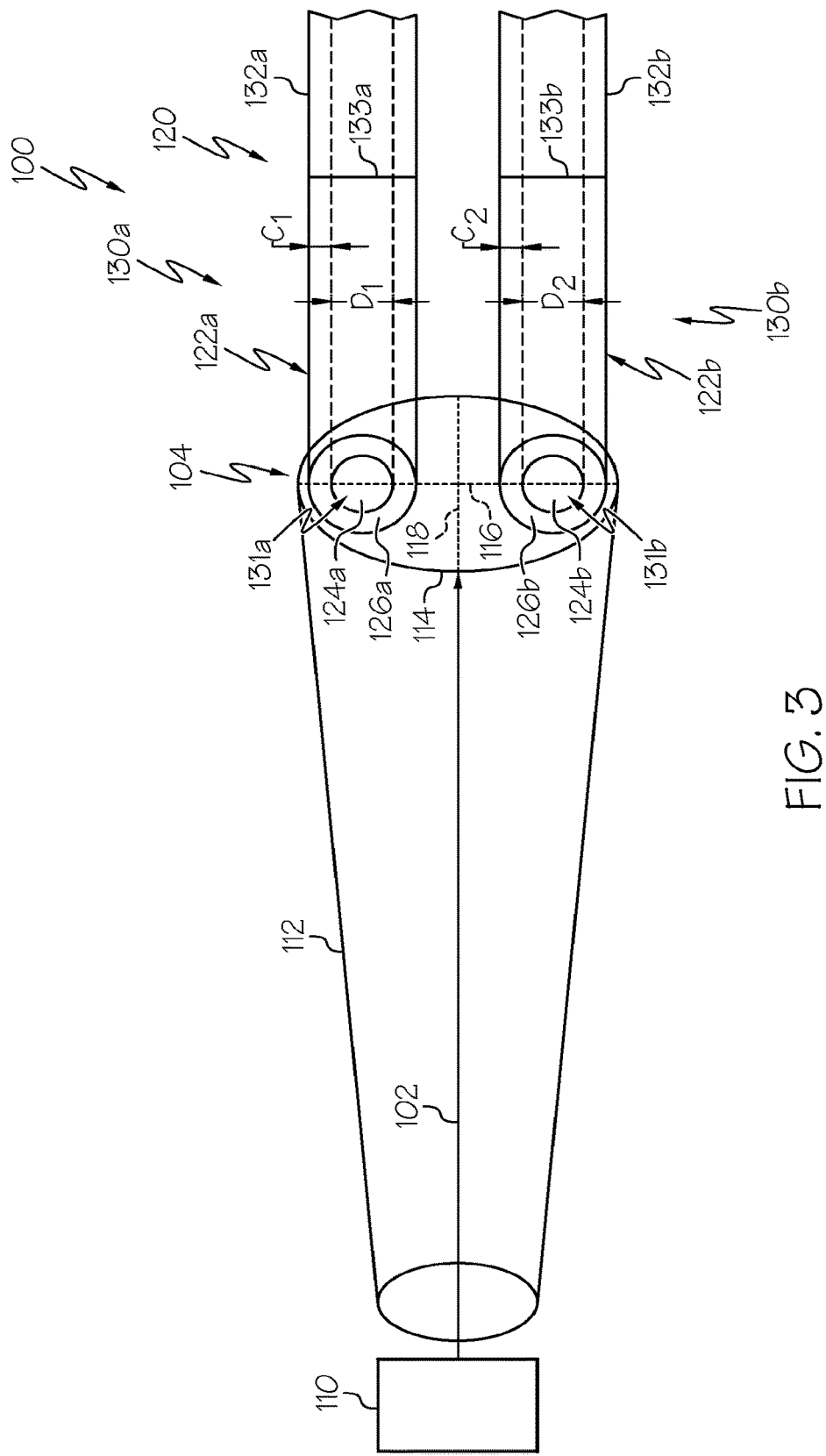
FIG. 3 schematically depicts an optical coupling system including a laser diode optically coupled to a first transport optical fiber and a second transport optical fiber at an optical coupling location, according to one or more embodiments described herein.

Referring now to FIG. 3, the first optical fiber end 122a may comprise a first transport optical fiber 130a and the second optical fiber end 122b may comprise a second transport optical fiber 130b. The first and second transport optical fibers 130a, 130b may comprise a length of transmissive optical fiber configured to receive light at a light receiving end 131a, 131b and output light at a fiber coupling end 133a, 133b with minimal attenuation. The light receiving ends 131a, 131b are positioned opposite the fiber coupling ends 133a, 133b. Further, the fiber coupling ends 133a, 133b of the first and second transport optical fibers 130a, 130b may be coupled to additional optical fibers. For example, as depicted in FIG. 3, the fiber coupling end 133a of the first transport optical fiber 130a may be optically coupled, for example, abutted, to a third optical fiber 132a and the fiber coupling end 133b of the second transport optical fiber 130b may be optically coupled, for example, abutted, to a fourth optical fiber 132b. The third optical fiber 132a and the fourth optical fiber 132b may each comprise any optical fiber. In some embodiments, the third optical fiber 132a and the fourth optical fiber 132b are light diffusing optical fibers. In some embodiments, the third optical fiber 132a and the fourth optical fiber 132b may be opposing ends of a single light diffusing optical fiber. In alternative embodiments, the third optical fiber 132a may comprise a third transport optical fiber, the fourth optical fiber 132b may comprise a fourth transport optical fiber, and light output ends of the third transport optical fiber and the fourth optical fiber may in turn be optically coupled to ends of separate light diffusing optical fibers or to opposing ends of a single light diffusing optical fiber. It should be understood that any number of transport optical fibers are contemplated.

Figure 4:
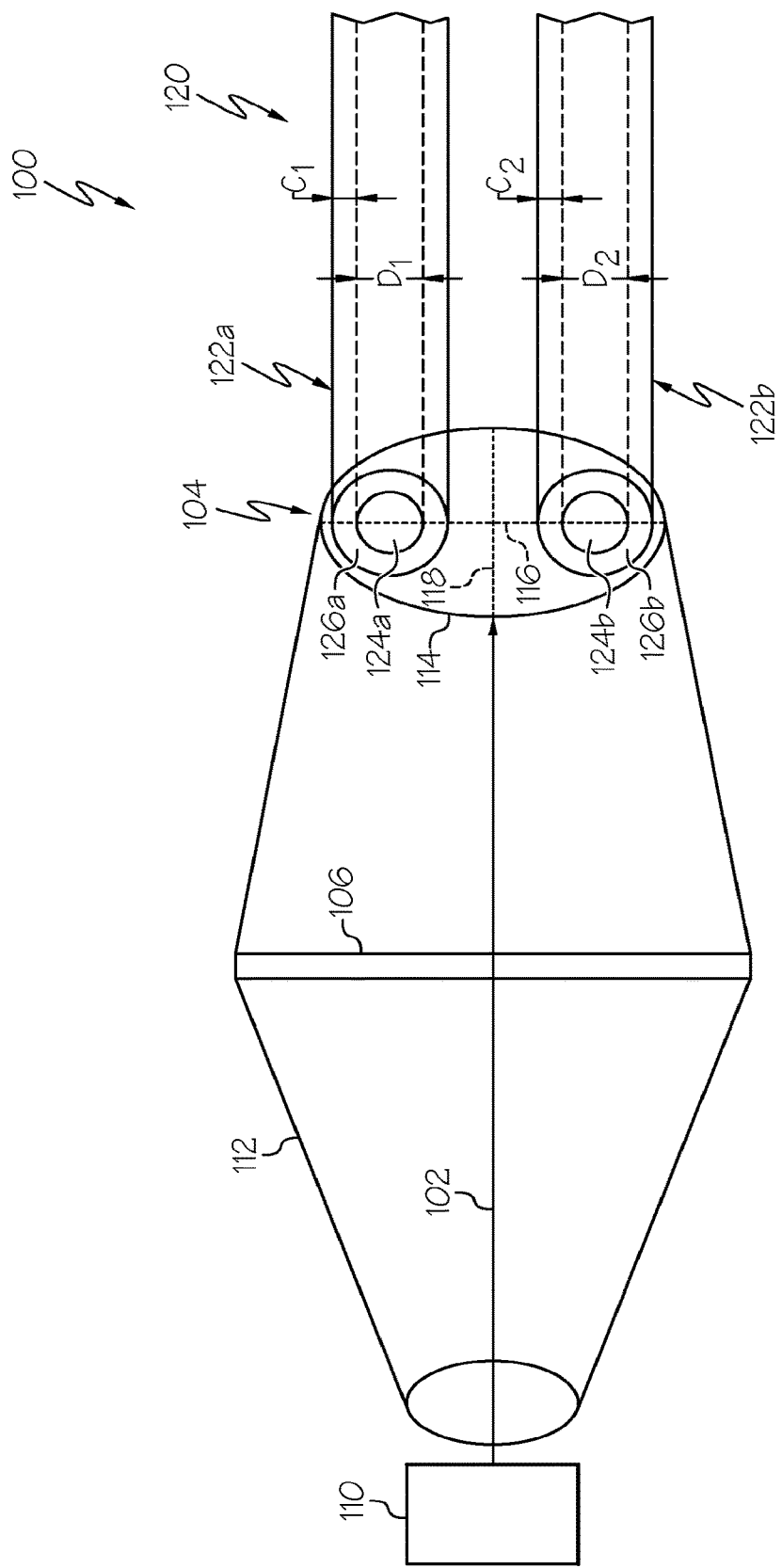
FIG. 4 schematically depicts the optical coupling system of FIG. 1 further including a focusing lens positioned between the laser diode and the first and second optical fiber ends, according to one or more embodiments described herein.

Referring now to FIG. 4, a focusing lens 106 may be positioned within the optical pathway 102 between the laser diode 110 and the first and second optical fiber ends 122a, 122b. The focusing lens 106 may comprise any focusing lens 106 that is configured to focus the light beam 112 into the first optical fiber end 122a and the second optical fiber end 122b. For example, the focusing lens 106 may comprise a spherical lens, an aspheric lens, a cylindrical lens, an anamorphic lens, a gradient index (GRIN) lens, a diffractive lens, a kinoform lens, or the like. In some embodiments, additional focusing lenses 106 may be contemplated. Positioning the focusing lens 106 within the optical pathway 102 between the laser diode 110 and the first and second optical fiber ends 122a, 122b may provide a coupling efficiency of between about 70% and about 90%. It should be understood that one or more focusing lens 106 may be optically disposed within the optical pathway 102 of any of the embodiments described herein, such as between the laser diode 110 and the optically coupled optical fiber ends of FIGS. 1-3 described above and of FIGS. 5-9 described below.

Referring now to FIGS. 5-8, the optical coupling system 100 may further comprise a fiber housing ferrule 150 having a first fiber housing hole 160a configured to house the first optical fiber end 122a and a second fiber housing hole 160b configured to house the second optical fiber end 122b. In some embodiments, such as the embodiment depicted in FIG. 5, the first optical fiber end 122a is an end of a first optical fiber and the second optical fiber end 122b is an end of a second optical fiber. In other embodiments, such as the embodiment depicted in FIG. 6, the first optical fiber end 122a and the second optical fiber end 122b are opposing ends of the same optical fibers. The first and second optical fiber ends 122a, 122b may comprise ends of any type of optical fiber, such as transport optical fibers, light diffusing optical fibers, or the like. In some embodiments, the first and second optical fiber ends 122a, 122b are adhered within the first and second fiber housing holes 160a, 160b, for example, using a transparent optical adhesive with a refractive index that is substantially similar to the refractive index of the cladding 126a, 126b.

As depicted in FIGS. 5-8, the ferrule body 152 of the fiber housing ferrule 150 has a light input end 154 opposite a light output end 156 and a longitudinal axis 151 extending between the light input end 154 and the light output end 156. In some embodiments, the ferrule body 152 may comprise a cylindrical rod, as shown in the isometric view in FIG. 7. However, in other embodiments, the ferrule body 152 may have a different shape, such as in embodiments in which the ferrule body 152 has a rectangular, triangular, elliptical, polygonal, or irregular cross-section. In some embodiments, the ferrule body 152 is optically transparent to visible light and UV light. In other embodiments, the ferrule body 152 may be translucent or opaque. In some embodiments, the ferrule body 152 is formed from a low index material such as a polymer, a plastic (e.g., fluorinated ethylene propylene (FEP)), or the like. In some embodiments, the ferrule body 152 is formed from glass (e.g., silica or the like), metal, or ceramic.

Figure 5:
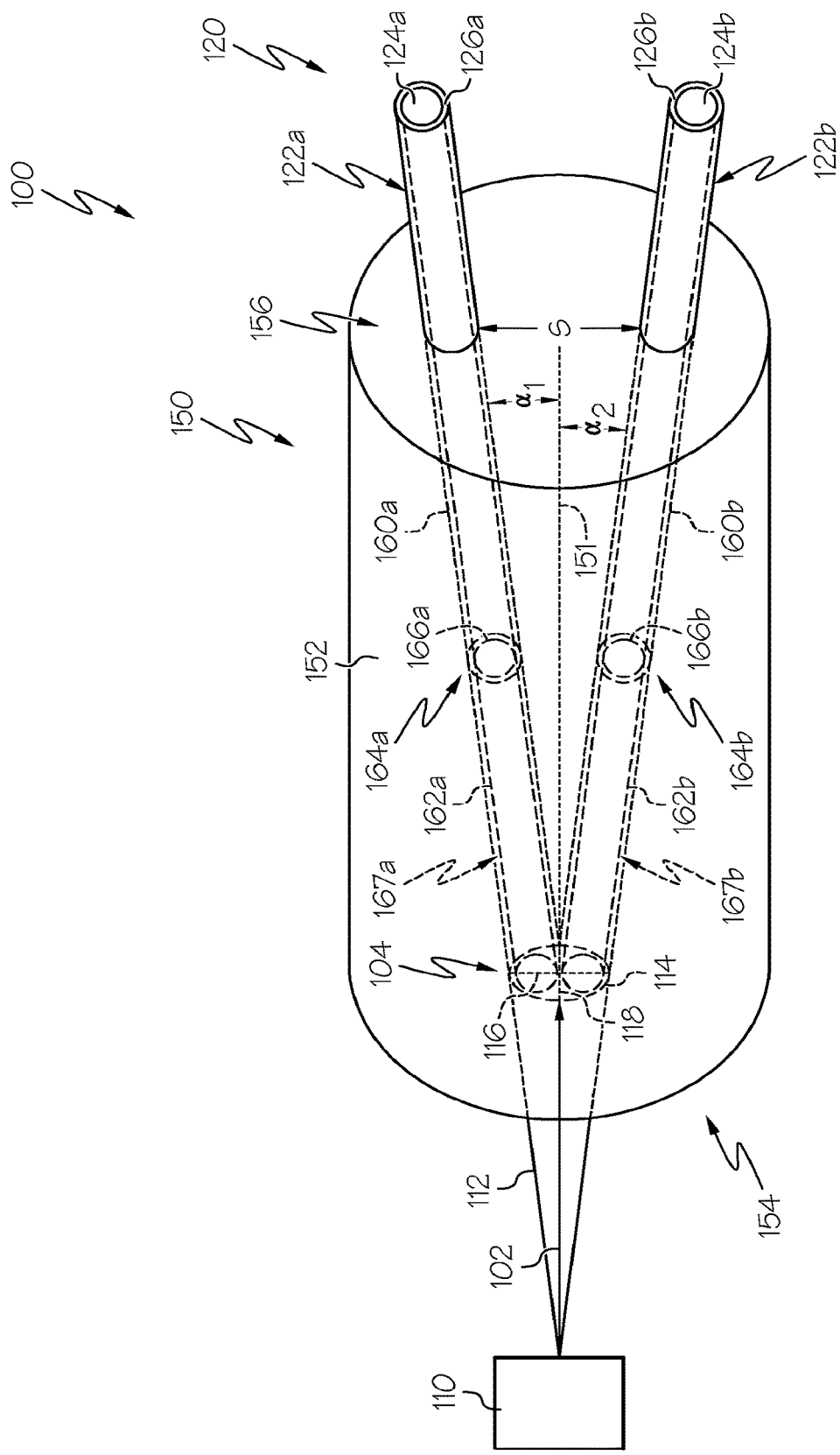
FIG. 5 schematically depicts an optical coupling system including a laser diode optically coupled to a first optical fiber end and a second optical fiber end, each positioned within a fiber housing ferrule, according to one or more embodiments described herein.
Figure 6:
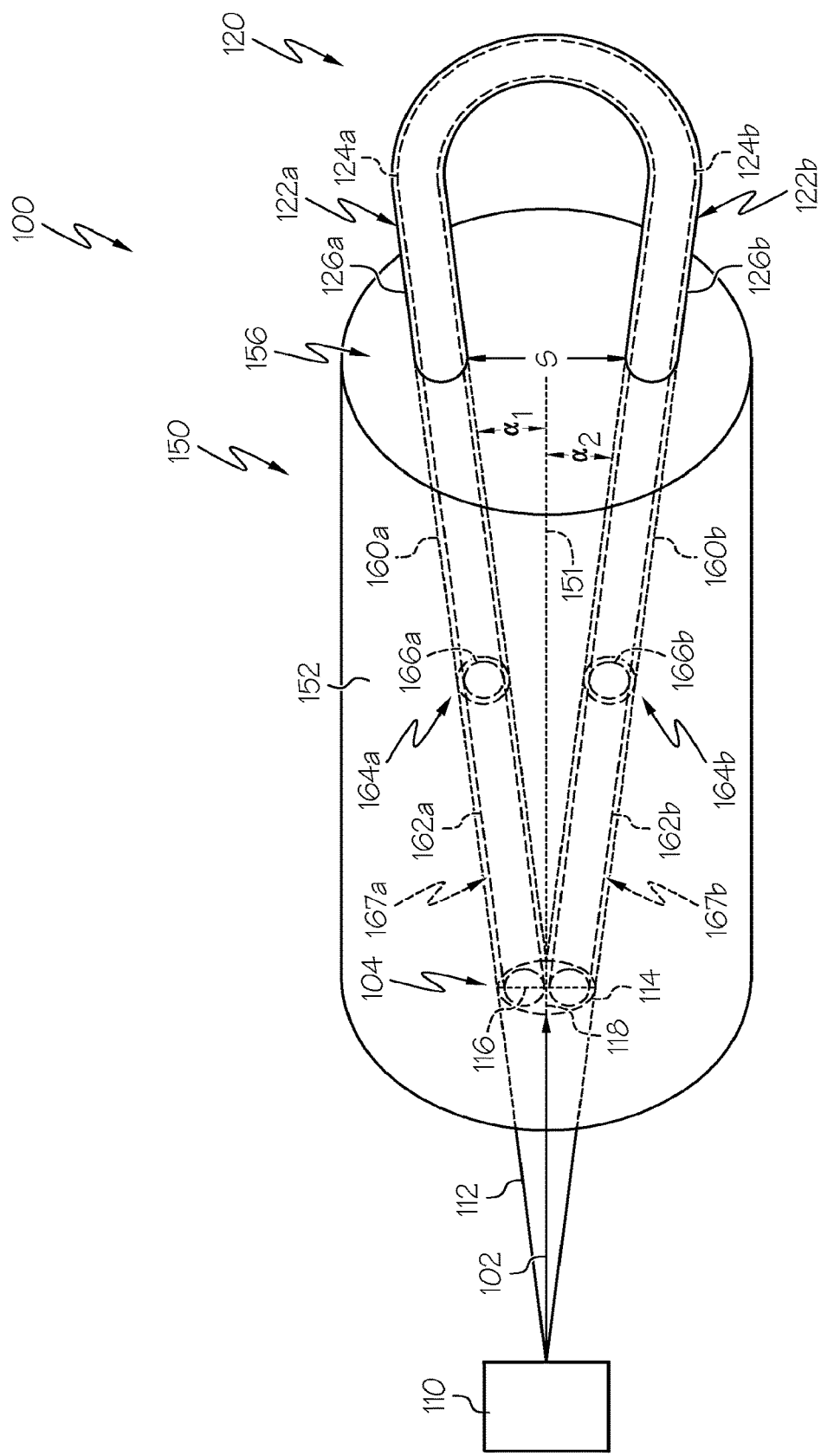
FIG. 6 schematically depicts an optical coupling system including a laser diode optically coupled to opposing optical fiber ends of an individual optical fiber positioned within the fiber housing ferrule of FIG. 5, according to one or more embodiments described herein.
Figure 7:
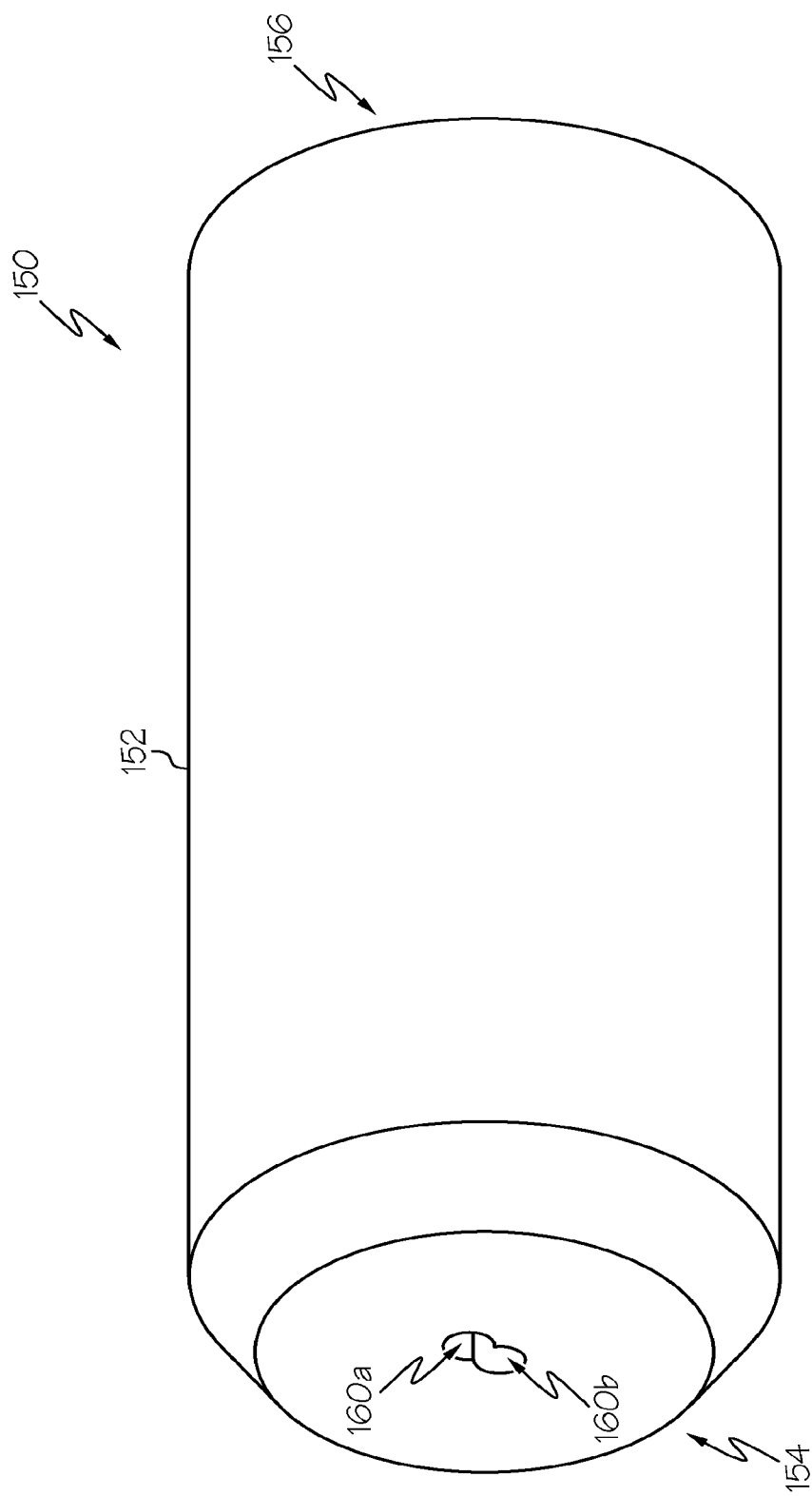
FIG. 7 depicts an isometric view of the fiber housing ferrule of FIGS. 5 and 6, according to one or more embodiments described herein.

Still referring to FIGS. 5-8, the first fiber housing hole 160a extends between the light input end 154 and the light output end 156 at a first angle $\alpha_1$ relative to the longitudinal axis 151 and the second fiber housing hole 160b extends between the light input end 154 and the light output end 156 at a second angle $\alpha_2$ relative to the longitudinal axis 151. In some embodiments, the first angle $\alpha_1$ and the second angle $\alpha_2$ are the same angle such that the first fiber housing hole 160a and the second fiber housing hole 160b extend symmetrically relative to the longitudinal axis 151. In some embodiments, the first angle $\alpha_1$ and the second angle $\alpha_2$ are different angles. In some embodiments, the first angle $\alpha_1$ and the second angle $\alpha_2$ are in the range from about 1°-25°. In some embodiments, one or more of the first angle $\alpha_1$ and the second angle $\alpha_2$ are 5°, 10°, 15°, or the like. As best shown in FIGS. 5-6, the first fiber housing hole 160a and the second fiber housing hole 160b are spaced apart at the light output end 156 by a separation distance s. The separation distance s decreases in a direction from the light output end 156 toward the light input end 154 such that the first fiber housing hole 160a is adjacently positioned to the second fiber housing hole 160b at the light input end 154, as shown in FIGS. 5-8. Accordingly, in this embodiment, when the first and second optical fiber ends 122a, 122b are positioned in the first and second fiber housing holes 160a, 160b, respectively, the first core 124a and the second core 124b may be adjacently positioned at the light input end 154, for example, within a threshold distance (e.g., about 25 μm) or in contact.

Still referring to FIGS. 5-8, in some embodiments, the first fiber housing hole 160a and the second fiber housing hole 160b are optically coupled to the laser diode 110 at the light input end 154 such that when the laser diode 110 emits the light beam 112, the first fiber housing hole 160a and the second fiber housing hole 160b are each positioned within the cross-sectional light beam profile 114. As stated above with respect to FIGS. 1-4, the cross-sectional light beam profile 114 may be asymmetrical. In embodiments in which the cross-sectional light beam profile 114 is asymmetrical, the first fiber housing hole 160a and the second fiber housing hole 160b may be positioned along the fast axis diameter 116 of the cross-sectional light beam profile 114 at the light input end 154 in the manner described above with respect to FIGS. 1-4. As depicted in FIGS. 5-6, the first optical fiber end 122a may be positioned within the first fiber housing hole 160a and the second optical fiber end 122b may be positioned within the second fiber housing hole 160b such that the light beam 112 may propagate into the first optical fiber end 122a and the second optical fiber end 122b. In alternative embodiments, the focusing lens 106 of FIG. 4 may be positioned between the laser diode 110 and the light input end 154.

Figure 8:
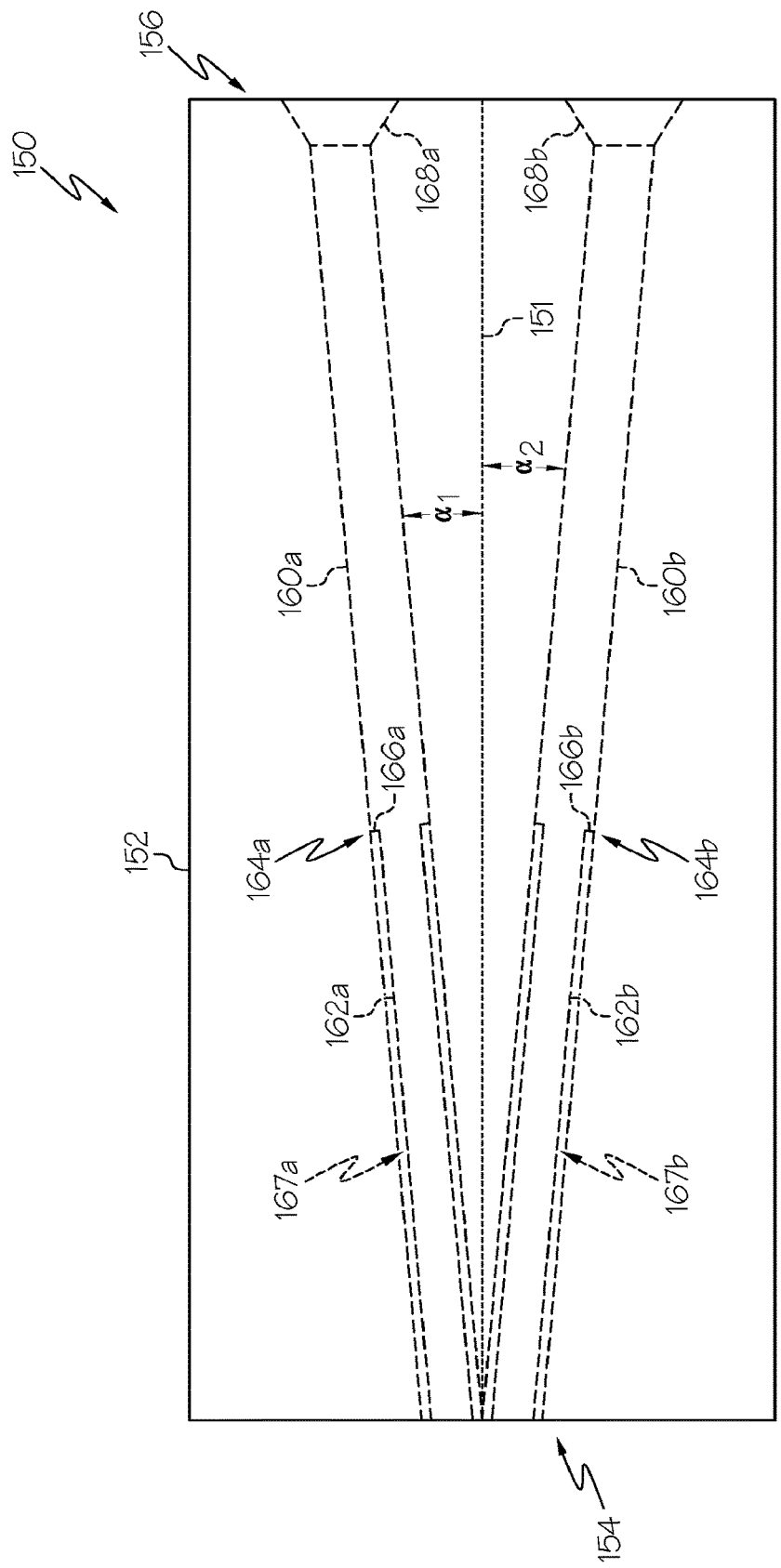
FIG. 8 schematically depicts a side view of the fiber housing ferrule of FIGS. 5-7, according to one or more embodiments described herein.

As depicted in FIGS. 5, 6, and 8, the first fiber housing hole 160a may comprise a first core receiving portion 162a and the second fiber housing hole 160b may comprise a second core receiving portion 162b. The first and second core receiving portions 162a, 162b extend from the light input end 154 toward the light output end 156. The first and second core receiving portions 162a, 162b also extend along the first and second fiber housing holes 160a. 160b, respectively, and comprise a diameter that is smaller than a diameter of the first and the second fiber housing holes 160a, 160b. Further, the first and second core receiving portions 162a, 162b are sized to receive the first and second cores 124a, 124b of the first and second optical fiber ends 122a, 122b, respectively. As depicted in FIGS. 5 and 6, the first and second core receiving portions 162a, 162b converge at the light input end 154 such that the first and second cores 124a, 124b of the first and second optical fibers ends 122a, 122b are in contact at the light input end 154 when positioned within the first and second fiber housing holes 160a, 160b.

In some embodiments, the first and second core receiving portions 162a, 162b each comprise a length that is less than a length of the first and second fiber housing holes 160a. 160b. For example, the first and second core receiving portions 162a, 162b may extend from the light input end 154 to a termination location 164a, 164b positioned between the light input end 154 and the light output end 156. The first and second core receiving portions 162a, 162b may terminate with first and second abutment shoulders 166a, 166b positioned at the termination locations 164a, 164b. The first and second abutment shoulders 166a, 166b are configured to abut the first and second cladding 126a, 126b, respectively, of partially stripped first and second optical fiber ends 122a, 122b. Further, as depicted in FIG. 8, the first and second fiber housing holes 160a, 160b may include first and second fiber insertion regions 168a, 168b located at the light output end 156 of the ferrule body 152. The first and second fiber insertion regions 168a, 168b may be frusto-conical in shape to aid in guiding the first and second optical fiber ends 122a, 122b into the first and second fiber housing holes 160a, 160b.

Referring still to FIGS. 5, 6, and 8, the first and second core receiving portions 162a, 162b are circumscribed by a first and second cladding matching region 167a, 167b. The first and second cladding matching region 167a, 167b may be substantially filled with a cladding matching material comprising a refractive index that matches the refractive index of the first and second cladding 126a, 126b. In some embodiments, the cladding matching material comprises a low refractive index epoxy that is UV curable and/or thermally curable.

In some embodiments, the first and second fiber housing holes 160a, 160b are configured to receive light diffusing optical fiber ends. In such embodiments, the diameter of each fiber housing hole 160a, 160b may be substantially equivalent (e.g., within a threshold distance of about 25 μm) to the diameter of the cladding 126a, 126b of the light diffusing optical fiber, for example, about 230 μm. Additionally, the diameter of the first and second core receiving portions 162a, 162b may be substantially equivalent (e.g., within a threshold distance of about 25 µm) to the diameter of the first and second cores 124a, 124b of the light diffusing optical fibers, for example, about 170 µm. In such embodiments, the refractive index of the cladding matching material positioned within the first and second cladding matching regions 167a, 167b may comprise a refractive index that is substantially the same as the refractive index of the light diffusing optical fiber cladding.

Referring again to FIGS. 5-8, the fiber housing ferrule may be fabricated by first providing a rod of a low index clear fluorinated plastic, such as FEP, and drilling first and second fiber housing holes 160a, 160b having first and second core receiving portions 162a, 162b into the rod. Next, the first and second cladding matching regions 167a, 167b of the first and second core receiving portions 162a, 162b are filled with the cladding matching material. The first and second optical fiber ends 122a, 122b are then cleaved, stripped to expose the first and second cores 124a, 124b, and inserted into the first and second fiber housing holes 160a, 160b. Next, the cladding matching material is UV cured or thermally cured from the light input end 154, the light output end 156, or a side of the ferrule body 152. Finally, the light input end 154 is polished. In some embodiments, the fiber housing ferrule 150 may be pre-shaped or fabricated for ease of use and integration into the TO package of the laser diode 110.

Figure 9:
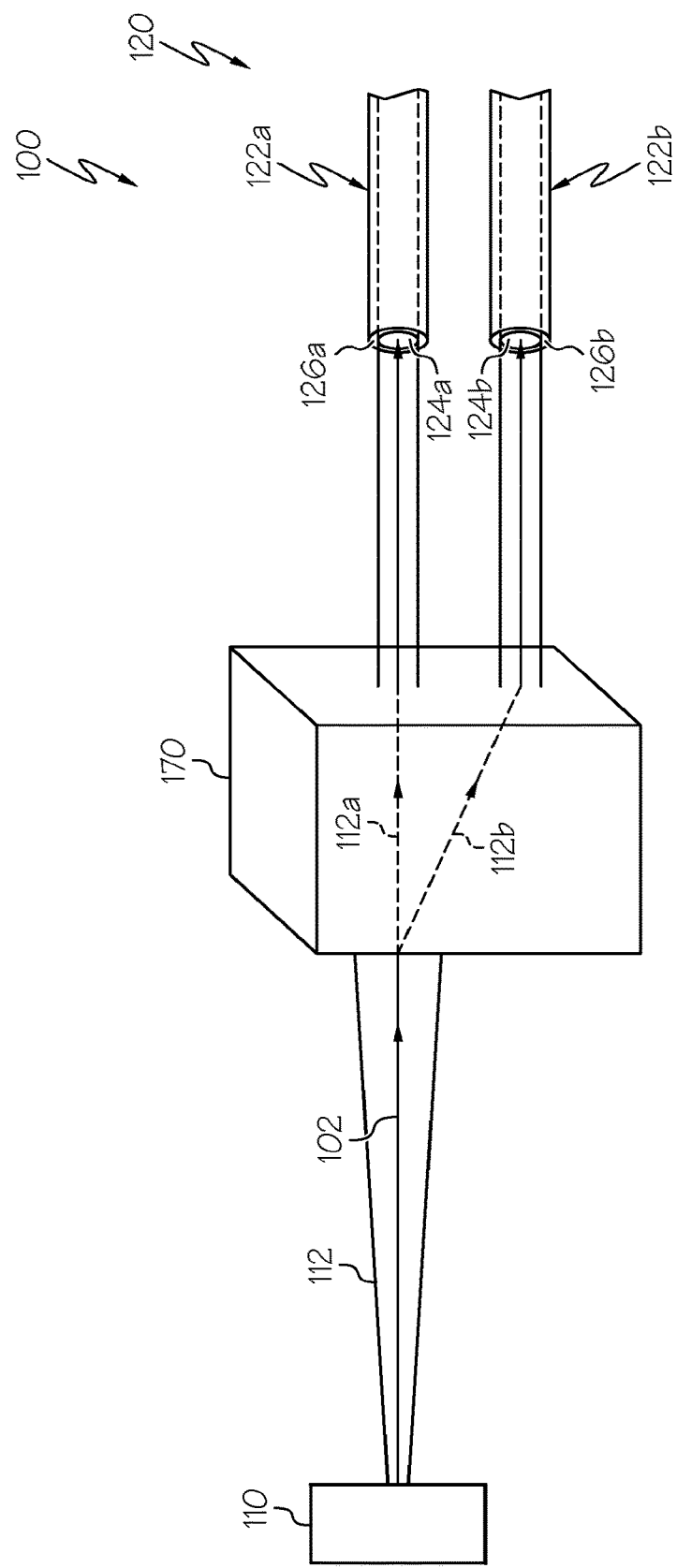
FIG. 9 schematically depicts an optical coupling system including a birefringent crystal positioned between a laser diode and a first and second optical fiber end, according to one or more embodiments described herein.

Referring now to FIG. 9, some embodiments of an optical coupling system 100 may include a birefringent crystal 170 positioned in the optical pathway 102 between the laser diode 110 and both the first optical fiber end 122a and the second optical fiber end 122b, which may be ends of a first light diffusing optical fiber and a second light diffusing optical fiber (as depicted in FIG. 9) or may be opposing ends of a single light diffusing optical fiber. The birefringent crystal 170 may be configured to: split the light beam 112 into a first light beam 112a (e.g., an ordinary ray) and a second light beam 112b (e.g., an extraordinary ray); direct the first light beam 112a into the first optical fiber end 122a (e.g., into the first core 124a); and direct the second light beam into the second optical fiber end 122b (e.g., into the second core 124b). In some embodiments, the first light beam 112a may be directed into an end of a light diffusing optical fiber and the second light beam 112b may be directed into an opposing end of the same light diffusing optical fiber. In some embodiments, one or more focusing lenses 106 may be positioned within the optical pathway 102, for example, between the laser diode 110 and the birefringent crystal 170, to direct the light beam 112 into the birefringent crystal 170. Alternatively or additionally, one or more focusing lenses 106 may be positioned between the birefringent crystal 170 and the first and/or second optical fiber ends 122a, 122b to direct the first light beam 112a into the first optical fiber end 122a and/or direct the second light beam 112b into the second optical fiber end 122b.

The birefringent crystal 170 may comprise any birefringent material, for example, $YVO_4$, $TiO_2$, $LiNBO_3$, $CaCO_3$, or the like. In some embodiments, the birefringent crystal 170 may comprise an optical axis of about 45°. In other embodiments, the birefringent crystal 170 may comprise any optical axis, for example, an optical axis less than 45° or an optical axis greater than 45°. Further, the birefringent crystal 170 comprises a propagation angle and may be rotated (e.g., processed) about the propagation angle to alter the respective power components of the first and second light beam 112a, 112b received by the first and second optical fiber ends 122a, 122b, respectively. In some embodiments, the birefringent crystal 170 may be rotated to a position with respect to the propagation angle such that the first and second light beams 112a, 112b comprise equivalent power components. In other embodiments, the birefringent crystal 170 may be rotated to a position with respect to the propagation angle such that the first and second light beams 112a, 112b comprise unbalanced power components. For example, it may be desired that the first optical fiber end 122a receives a larger or smaller power component than the second optical fiber end 122b. It should be understood that the power components of the first light beam 112a and the second light beam 112b may be tuned by altering the rotation of the birefringent crystal 170 with respect to the propagation angle of the birefringent crystal 170.

Further, a thickness of the birefringent crystal 170 along the optical pathway 102 affects the spacing between the first light beam 112a and the second light beam 112b. An example birefringent crystal 170 comprising a 10 mm thickness produces a separation between the first light beam 112a and the second light beam 112b of about 1 mm. Another example birefringent crystal 170 comprising a 2 mm thickness produces a separation between the first light beam 112a and the second light beam 112b of about 230 µm. Further, a cut angle of the birefringent crystal 170 may affect the spacing between the first light beam 112a and the second light beam 112b. It should be understood that the separation between the first light beam 112a and the second light beam 112b may be tuned by altering the thickness of the birefringent crystal 170 and/or altering the cut angle of the birefringent crystal 170.

It should now be understood that the optical coupling systems described herein include a laser diode optically coupled to a plurality of optical fiber ends. In some embodiments, the laser diode is configured to emit a light beam comprising a cross-sectional light beam profile, for example, an asymmetrical cross-sectional light beam profile. The plurality of optical fiber ends may be optically coupled to the cross-sectional light beam profile at an optical coupling location. The optical coupling system may further comprise a fiber housing ferrule having fiber housing holes configured to house and adjacently position optical fiber ends at a light input end. Further, the optical coupling system may comprise a birefringent crystal configured to split a light beam emitted by the laser diode and direct portions of the light beam into two optical fiber ends. The optical fiber coupling systems herein provide small and low cost systems of optically coupling a laser diode to multiple optical fiber ends by reducing the number of laser diodes needed to illuminate multiple optical fiber ends. The optical fiber coupling systems herein also facilitate optical coupling between a laser diode and opposing ends of a light diffusing optical fiber, which improves illumination uniformity along the length of the light diffusing optical fiber.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An optical coupling system comprising:
a first optical fiber end having a first core;
a second optical fiber end having a second core; and
a laser diode optically coupled to the first core of the first optical fiber end and the second core of the second optical fiber end at an optical coupling location, wherein:
the laser diode emits a light beam having an asymmetrical cross-sectional light beam profile comprising a fast axis diameter and a slow axis diameter;
the fast axis diameter is longer than the slow axis diameter; and
the first optical fiber end and the second optical fiber end are adjacently positioned along the fast axis diameter of the asymmetrical cross-sectional light beam profile of the laser diode at the optical coupling location such that the first core and the second core are within the asymmetrical cross-sectional light beam profile at the optical coupling location.

2. The optical coupling system of claim 1, wherein the fast axis diameter is greater than or equal to a sum of a core diameter of the first core and a core diameter of the second core.

3. The optical coupling system of claim 1, wherein the first optical fiber end is an end of a first light diffusing optical fiber, and the second optical fiber end is an end of a second light diffusing optical fiber.

4. The optical coupling system of claim 1, wherein the first optical fiber end is a light receiving end of a first transport optical fiber, the second optical fiber end is a light receiving end of a second transport optical fiber, the first transport optical fiber includes a fiber coupling end optically coupled to a third optical fiber, and the second transport optical fiber includes a fiber coupling end optically coupled to a fourth optical fiber, wherein the third optical fiber and the fourth optical fiber are light diffusing optical fibers.

5. The optical coupling system of claim 1, wherein the first optical fiber end is a light receiving end of a first transport optical fiber, the second optical fiber end is a light receiving end of a second transport optical fiber, the first transport optical fiber includes a fiber coupling end optically coupled to a third optical fiber end, the second transport optical fiber includes a fiber coupling end optically coupled to a fourth optical fiber end, wherein the third optical fiber end and the fourth optical fiber end are opposing ends of a light diffusing optical fiber.

6. The optical coupling system of claim 1, further comprising a fiber housing ferrule configured to house the first optical fiber end and the second optical fiber end, the fiber housing ferrule comprising:
a ferrule body having a light input end opposite a light output end;
a first fiber housing hole extending between the light input end and the light output end at a first angle relative to a longitudinal axis of the fiber housing ferrule;
a second fiber housing hole extending between the light input end and the light output end at a second angle relative to the longitudinal axis of the fiber housing ferrule, wherein:
the first fiber housing hole and the second fiber housing hole are spaced apart at the light output end;
a separation distance between the first fiber housing hole and the second fiber housing hole decreases in a direction from the light output end toward the light input end;
the first fiber housing hole is adjacent to the second fiber housing hole at the light input end;
the light input end is at the optical coupling location; and
the first fiber housing hole and the second fiber housing hole are optically coupled to the laser diode at the light input end such that when the laser diode emits the light beam, the first fiber housing hole and the second fiber housing hole are each positioned within the asymmetrical cross-sectional light beam profile of the light beam at the light input end.

7. The optical coupling system of claim 1, wherein the first optical fiber end and the second optical fiber end are opposing ends of a light diffusing optical fiber.

8. The optical coupling system of claim 1, further comprising a focusing lens optically disposed between the laser diode and the first optical fiber end and the second optical fiber end, wherein the focusing lens is configured to focus the light beam onto the first optical fiber end and the second optical fiber end.

9. An optical coupling system comprising:
a laser diode emitting a light beam; and
a fiber housing ferrule configured to house a first optical fiber end and a second optical fiber end, the fiber housing ferrule comprising:
a ferrule body having a light input end opposite a light output end;
a first fiber housing hole extending between the light input end and the light output end at a first angle relative to a longitudinal axis of the fiber housing ferrule;
a second fiber housing hole extending between the light input end and the light output end at a second angle relative to the longitudinal axis of the fiber housing ferrule, wherein:
the first fiber housing hole and the second fiber housing hole are spaced apart at the light output end;
a separation distance between the first fiber housing hole and the second fiber housing hole decreases in a direction from the light output end toward the light input end;
the first fiber housing hole is adjacent to the second fiber housing hole at the light input end; and
the first fiber housing hole and the second fiber housing hole are optically coupled to the laser diode at the light input end such that when the laser diode emits the light beam, the first fiber housing hole and the second fiber housing hole are each positioned within a cross-sectional light beam profile of the light beam at the light input end.

10. The optical coupling system of claim 9, further comprising the first optical fiber end and the second optical fiber end, wherein the first optical fiber end is positioned within the first fiber housing hole and the second optical fiber end is positioned within the second fiber housing hole, such that the laser diode is optically coupled to the first optical fiber end and the second optical fiber end.

11. The optical coupling system of claim 10, wherein the first optical fiber end is an end of a first light diffusing optical fiber, and the second optical fiber end is an end of a second light diffusing optical fiber.

12. The optical coupling system of claim 10, wherein the first optical fiber end and the second optical fiber end are opposing ends of a light diffusing optical fiber.

13. The optical coupling system of claim 9, wherein each of the first fiber housing hole and the second fiber housing hole comprise a core receiving portion extending from the light input end, wherein:
   a core receiving portion diameter is sized to receive a core of an optical fiber end; and
   the core receiving portion is circumscribed by a cladding matching material.

14. The optical coupling system of claim 13, wherein the cladding matching material comprises a refractive index that matches a refractive index of a cladding of the optical fiber end.

15. The optical coupling system of claim 13, wherein the core receiving portion of each of the first fiber housing hole and the second fiber housing hole converges at the light input end such that two cores of two optical fibers ends are in contact when positioned within the first fiber housing hole and the second fiber housing hole at the light input end.

16. The optical coupling system of claim 9, wherein:
   the cross-sectional light beam profile of the light beam is asymmetrical and comprises
   a fast axis diameter and a slow axis diameter;
   the fast axis diameter is longer than the slow axis diameter; and
   the first fiber housing hole and the second fiber housing hole are positioned in optical alignment with the laser diode along the fast axis diameter of the cross-sectional light beam profile at the light input end such that the first fiber housing hole and the second fiber housing hole are within the cross-sectional light beam profile of the light beam at the light input end.

* * * * *